United States Patent
Karhade et al.

(10) Patent No.: US 9,741,692 B2
(45) Date of Patent: Aug. 22, 2017

(54) METHODS TO FORM HIGH DENSITY THROUGH-MOLD INTERCONNECTIONS

(71) Applicants: Omkar G. Karhade, Chandler, AZ (US); Nitin A. Deshpande, Chandler, AZ (US); Edvin Cetegen, Chandler, AZ (US); Eric J. Li, Chandler, AZ (US); Debendra Mallik, Chandler, AZ (US); Bassam M. Ziadeh, Gilbert, AZ (US)

(72) Inventors: Omkar G. Karhade, Chandler, AZ (US); Nitin A. Deshpande, Chandler, AZ (US); Edvin Cetegen, Chandler, AZ (US); Eric J. Li, Chandler, AZ (US); Debendra Mallik, Chandler, AZ (US); Bassam M. Ziadeh, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/767,471

(22) PCT Filed: Sep. 15, 2014

(86) PCT No.: PCT/US2014/055612
§ 371 (c)(1),
(2) Date: Aug. 12, 2015

(87) PCT Pub. No.: WO2016/043697
PCT Pub. Date: Mar. 24, 2016

(65) Prior Publication Data
US 2016/0268231 A1 Sep. 15, 2016

(51) Int. Cl.
*H01L 25/00* (2006.01)
*H01L 25/065* (2006.01)
(Continued)

(52) U.S. Cl.
CPC ........ *H01L 25/0657* (2013.01); *H01L 21/565* (2013.01); *H01L 21/76802* (2013.01);
(Continued)

(58) Field of Classification Search
CPC . H01L 25/0657; H01L 23/3142; H01L 24/17; H01L 21/565
(Continued)

(56) References Cited

U.S. PATENT DOCUMENTS 5,144,412 A * 9/1992 Chang .................. H01L 21/486
257/665
9,601,353 B2 * 3/2017 Huang .................. H01L 21/565
(Continued)

FOREIGN PATENT DOCUMENTS

CN 102668065 A 9/2012
EP 2506298 A1 10/2012
(Continued)

OTHER PUBLICATIONS

International Search Report and Written Opinion received for PCT Patent Application No. PCT/US2014/055612, mailed Jun. 16, 2015, 13 pages.
(Continued)

*Primary Examiner* — Moazzam Hossain
(74) *Attorney, Agent, or Firm* — Winkle, PLLC (57) ABSTRACT

Methods of fabricating a microelectronic device comprising forming a microelectronic substrate having a plurality microelectronic device attachment bond pads and at least one interconnection bond pad formed in and/or on an active surface thereof, attaching a microelectronic device to the plurality of microelectronic device attachment bond pads, forming a mold chase having a mold body and at least one projection extending from the mold body, wherein the at least one projection includes at least one sidewall and a
(Continued)

contact surface, contacting the mold chase projection contact surface to a respective microelectronic substrate interconnection bond pad, disposing a mold material between the microelectronic substrate and the mold chase, and removing the mold chase to form at least one interconnection via extending from a top surface of the mold material to a respective microelectronic substrate interconnection bond pad.

14 Claims, 9 Drawing Sheets

(51) Int. Cl.
- H01L 23/00 (2006.01)
- H01L 23/31 (2006.01)
- H01L 21/56 (2006.01)
- H01L 21/768 (2006.01)
- H01L 25/10 (2006.01)
- H01L 23/498 (2006.01)

(52) U.S. Cl.
CPC .... *H01L 21/76877* (2013.01); *H01L 23/3142* (2013.01); *H01L 23/49811* (2013.01); *H01L 24/17* (2013.01); *H01L 25/105* (2013.01); *H01L 25/50* (2013.01); *H01L 24/13* (2013.01); *H01L 24/16* (2013.01); *H01L 24/32* (2013.01); *H01L 24/81* (2013.01); *H01L 24/83* (2013.01); *H01L 24/92* (2013.01); *H01L 2224/0401* (2013.01); *H01L 2224/133* (2013.01); *H01L 2224/1329* (2013.01); *H01L 2224/13111* (2013.01); *H01L 2224/13113* (2013.01); *H01L 2224/13116* (2013.01); *H01L 2224/13139* (2013.01); *H01L 2224/13147* (2013.01); *H01L 2224/16227* (2013.01); *H01L 2224/16235* (2013.01); *H01L 2224/32225* (2013.01); *H01L 2224/73204* (2013.01); *H01L 2224/81201* (2013.01); *H01L 2224/81203* (2013.01); *H01L 2224/81205* (2013.01); *H01L 2224/81207* (2013.01); *H01L 2224/81815* (2013.01); *H01L 2224/83102* (2013.01); *H01L 2224/92125* (2013.01); *H01L 2225/06517* (2013.01); *H01L 2225/06548* (2013.01); *H01L 2225/1023* (2013.01); *H01L 2225/1058* (2013.01); *H01L 2924/014* (2013.01); *H01L 2924/01028* (2013.01); *H01L 2924/0133* (2013.01); *H01L 2924/01047* (2013.01); *H01L 2924/01079* (2013.01); *H01L 2924/01322* (2013.01); *H01L 2924/1433* (2013.01); *H01L 2924/1434* (2013.01); *H01L 2924/1579* (2013.01); *H01L 2924/15192* (2013.01); *H01L 2924/15311* (2013.01)

(58) Field of Classification Search
USPC .......................................................... 438/107
See application file for complete search history.

(56) References Cited

U.S. PATENT DOCUMENTS

| | | | |
|---|---|---|---|
| 2008/0284066 A1 | 11/2008 | Kuan et al. | |
| 2009/0057918 A1 | 3/2009 | Kim | |
| 2009/0093087 A1 | 4/2009 | Murakami et al. | |
| 2010/0244212 A1* | 9/2010 | Ha | H01L 21/568 |
| | | | 257/676 |
| 2011/0117700 A1 | 5/2011 | Weng et al. | |
| 2012/0013001 A1* | 1/2012 | Haba | H01L 21/561 |
| | | | 257/737 |
| 2012/0228782 A1 | 9/2012 | Kawata et al. | |
| 2013/0119549 A1* | 5/2013 | Cheng | B29C 39/10 |
| | | | 257/772 |
| 2013/0339762 A1* | 12/2013 | Bose | H01L 23/00 |
| | | | 713/300 |
| 2014/0252609 A1* | 9/2014 | Lee | H01L 23/49816 |
| | | | 257/738 |
| 2014/0264789 A1* | 9/2014 | Yang | H01L 23/49838 |
| | | | 257/666 |
| 2015/0206863 A1* | 7/2015 | Graf | H01L 24/83 |
| | | | 257/738 |
| 2017/0004980 A1* | 1/2017 | Park | H01L 21/565 |

FOREIGN PATENT DOCUMENTS

| | | |
|---|---|---|
| JP | 2004-311668 A | 11/2004 |
| JP | 2011-031668 A | 2/2011 |
| KR | 10-2012-0109524 A | 10/2012 |
| NO | 2011/064971 A1 | 6/2011 |

OTHER PUBLICATIONS

Office Action and Search Report received for Taiwanese Patent Application No. 104125945, mailed on Dec. 29, 2016, 11 pages of Taiwanese Office Action including 6 Pages of English Translation.
Office Action received for Japanese Patent Application No. 2016-549013, mailed on Oct. 25, 2016, 9 pages of Japanese Office Action including 4 Pages of English Translation.
Notice of Allowance received for Taiwan Patent Application No. 104125945, dated Mar. 23, 2017, 2 pages of Official copy only.
International Preliminary Report on Patentability and Written Opinion received for PCT Patent Application No. PCT/US2014/055612, dated Mar. 30, 2017, 10 pages.

\* cited by examiner

METHODS TO FORM HIGH DENSITY THROUGH-MOLD INTERCONNECTIONS

TECHNICAL FIELD

Embodiments of the present description generally relate to the field of microelectronic package fabrication, and, more particularly, to forming high density interconnections for package-on-package microelectronic devices.

BACKGROUND

The microelectronic industry is continually striving to produce ever faster and smaller microelectronic packages for use in various electronic products, including, but not limited to, computer server products and portable products, such as portable computers, electronic tablets, cellular phones, digital cameras, and the like. One route to achieve these goals is the fabrication of stacked packages. On type of package stacking, called Package-on-Package (PoP) stacking, is becoming an important solution for mobile and wireless applications that require small lateral dimensions, low package heights, and high bandwidth between the microelectronic devices within the Package-on-Package stacked structure. Therefore, there is an ongoing effort to improve the fabrication efficiency for such microelectronic devices.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description include methods of fabricating a microelectronic device comprising forming a microelectronic substrate having a plurality microelectronic device attachment bond pads and at least one interconnection bond pad formed in and/or on an active surface thereof, attaching a microelectronic device to the plurality of microelectronic device attachment bond pads, forming a mold chase having a mold body and at least one projection extending from the mold body, wherein the at least one projection includes at least one sidewall and a contact surface, contacting the mold chase projection contact surface to a respective microelectronic substrate interconnection bond pad, disposing a mold material between the microelectronic substrate and the mold chase, and removing the mold chase to form at least one interconnection via extending from a top surface of the mold material to a respective microelectronic substrate interconnection bond pad. Embodiments for the present description may be advantageous over known drilling techniques for forming the interconnection vias, such as laser drilling, as such techniques are expensive and cleaning is necessary for residue removal resulting from the drilling.

Figure 1:
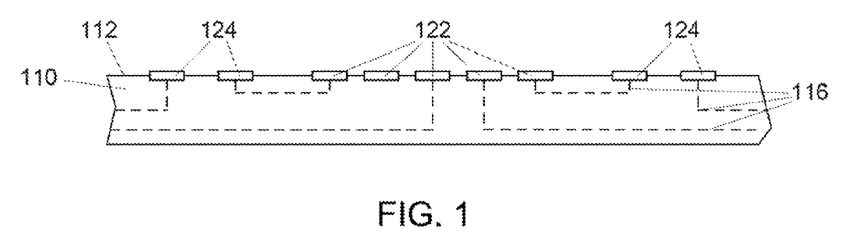
FIGS. 1-8 are side cross sectional views of a process of fabricating a package-on-package microelectronic device, according to an embodiment of the present description.

FIGS. 1-8 illustrate an embodiment of fabricating a package-on-package microelectronic device 100. As shown in FIG. 1, a microelectronic substrate 110 may be formed. The microelectronic substrate 110 may be any appropriate substrate, such as an interposer or the like, having a first surface 112. The microelectronic substrate 110 may have a plurality of bond pads, comprising at least one microelectronic device attachment bond pad 122 and at least one interconnection bond pads 124, formed in or on the microelectronic substrate first surface 112. The microelectronic substrate 110 may comprise a plurality of dielectric layers (not illustrated) having a plurality of conductive routes 116 formed therethrough, wherein the conductive routes 116 may form connections between appropriate bond pads, such as the microelectronic device attachment bond pads 122 and the microelectronic substrate intereconnection bond pads 124, and/or external devices (not shown).

The microelectronic substrate 110 may comprise any appropriate dielectric material, including, by not limited to, liquid crystal polymer, epoxy resin, bismaleimide triazine resin, FR4, polyimide materials, and the like. The conductive routes 116 may be formed of any appropriate conductive material, including, but not limited to, copper, silver, gold, nickel, and alloys thereof. It is understood that the microelectronic substrate 110 may be formed from any number of dielectric layers, may contain a rigid core (not shown), and may contain active and/or passive microelectronic devices (not shown) formed therein. It is further understood that the conductive routes 116 could form any desired electrical route within the microelectronic substrate 110 and/or with additional external components (not shown). It is also understood that solder resist layers (not shown) could be utilized on the microelectronic substrate first surface 112, as will be understood to those skilled in the art. The processes used for forming the microelectronic substrate 110 are well known to those skilled in the art, and for the sake of brevity and conciseness will not be described or illustrated herein.

Figure 2:
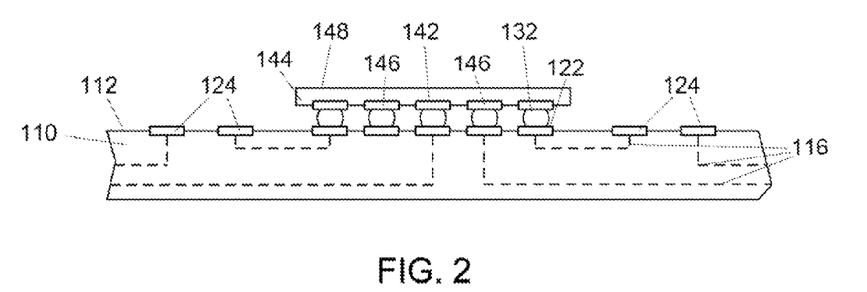

As shown in FIG. 2, a microelectronic device 142 having an active surface 144 and an opposing back surface 148 may be attached to corresponding microelectronic device attachment bond pads 122 with a plurality of device-to-substrate interconnects 132, in a configuration generally known as a flip-chip or controlled collapse chip connection ("C4") configuration. The device-to-substrate interconnects 132 may extend between the microelectronic device attachment bond pads 122 and mirror-image bond pads 146 on the microelectronic device active surface 144 to form an electrical connection therebetween. It is understood that the microelectronic device bond pads 146 may be in electrical communication with integrated circuitry (not shown) within the microelectronic device 142. The microelectronic device 142 may be any appropriate microelectronic device, including, but not limited to a microprocessor, a chipset, a graphics device, a wireless device, a memory device, an application specific integrated circuit device, and the like.

The device-to-substrate interconnects 132 can be made any appropriate material, including, but not limited to, solders and conductive filled epoxies. Solder materials may include may be any appropriate material, including but not limited to, lead/tin alloys, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys. When the microelectronic device 142 is attached to the microelectronic substrate 110 with device-to-substrate interconnects 132 made of solder, the solder is reflowed, either by heat, pressure, and/or sonic energy to secure the solder between the microelectronic device bond pads 146 and the microelectronic device attachment bond pads 122. Additionally, the microelectronic device 142 may be a copper pillar based flip chip component which is attached to the substrate 110, as will be understood to those skilled in the art. It is further understood that, an electrically-insulating flowable material, such as an underfill material (not shown), may be disposed between the microelectronic device 142 and the microelectronic substrate 110, which substantially encapsulates the device-to-substrate interconnects 132.

Figure 3:
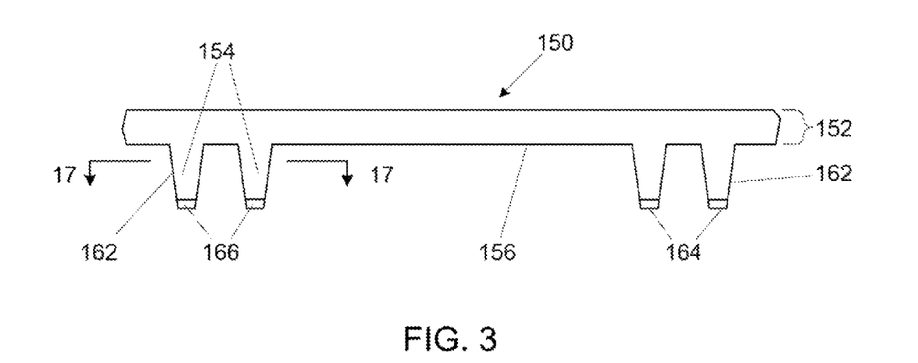

As shown in FIG. 3, a mold chase 150 may be formed having a mold body 152 with at least one projection 154 extending from a first surface 156 of the mold body 152. The mold chase projections 154 each include at least one sidewall 162 extending from the mold body 152 and terminating in a contact surface 164. In one embodiment, the mold chase projection contact surfaces 164 are substantially parallel to the mold body first surface 156. The mold chase 150 may be made of any substantially rigid material, including but not limited to metal and polymer materials. In an embodiment, a portion 166 of at least one mold chase projection 154 proximate and including the mold chase projection contact surface 164 may comprises a resilient material that is different from the remainder of the mold chase projection 154. This mold chase projection resilient portion 166 may be used when there is a risk of damage to the microelectronic substrate interconnection bond pads 124 (see FIG. 2) when the mold chase 150 is brought into contact therewith, as will be discussed, and may absorb any height tolerances, as will be understood to those skilled in the art. The resilient mold chase projection portion 166 may be made of any material, which when subjected to a compressive force will return to its original shape when the compressive force is released, including but not limited to butyl rubbers, ethylene propylene rubbers, fluoropolymer elastomers, or combinations thereof.

Figure 4:
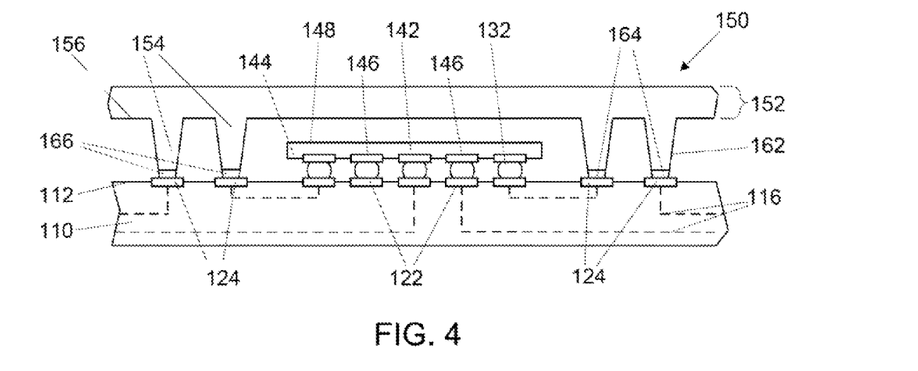

As shown in FIG. 4, the mold chase 150 may be brought into contact with the microelectronic substrate 110, wherein at least one mold chase projection contact surface 164 contacts a respective microelectronic substrate interconnection bond pad 124. In one embodiment, a plurality mold chase projections 154 may have a mirror-image configuration to and in contact with a plurality of respective microelectronic substrate interconnection bond pads 124.

Figure 5:
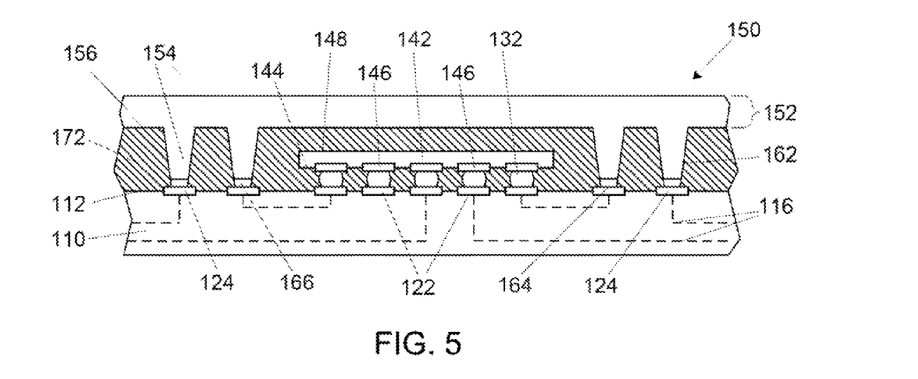

As shown in FIG. 5, a mold material 172 may be disposed between the microelectronic substrate 110 and the mold chase 150. In one embodiment, the mold material 172 may substantially encapsulate the microelectronic device 142 (e.g. extending over the microelectronic device back surface 148 and between the microelectronic device active surface 144 and the microelectronic substrate 110) and may substantially surround the at least one mold chase projection sidewall 162. The mold material 172 may be any appropriate encapsulation material, such as an epoxy resins and filled epoxy resins.

Figure 6:
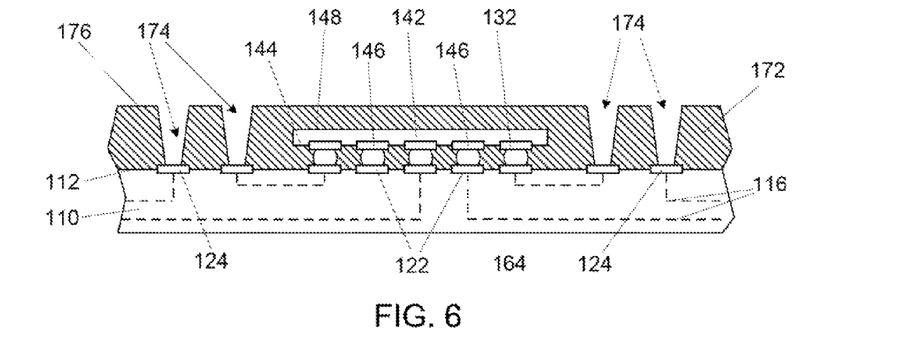
Figure 7:
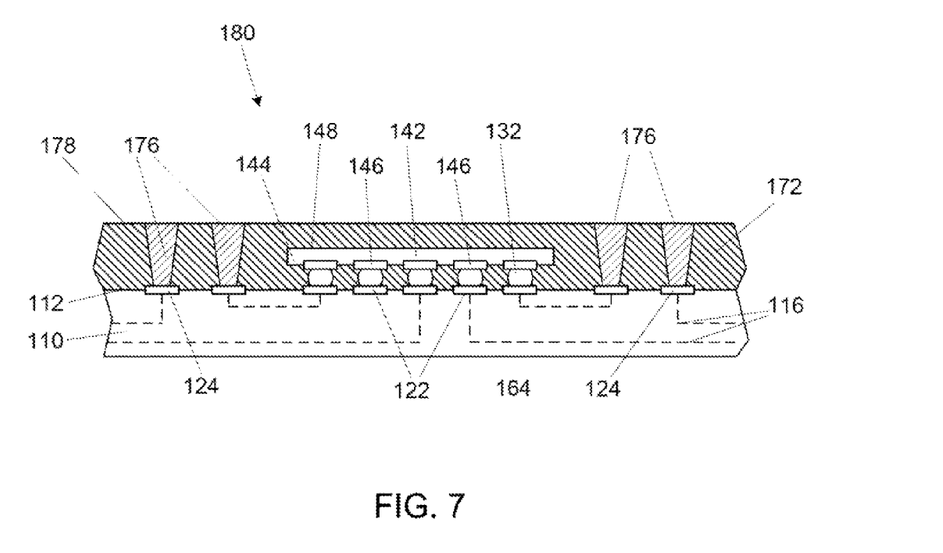

As shown in FIG. 6, the mold material 172 may be cured, either fully or partially, such as by heating, and the mold chase 150 (see FIG. 5) may be removed to form at least one interconnection via 174 extending from a top surface 178 of the mold material to a respective microelectronic substrate interconnection bond pad 124. As shown in FIG. 7, the interconnection vias 174 (see FIG. 6) may be filled with a conductive material to form through-mold interconnections 176, and thereby forming a first microelectronic package 180. The through-mold interconnections 176 may comprise any appropriate conductive material, including, but not limited to, solder or solder paste. Referring back to FIG. 3, the mold chase projections 154 may be tapered (e.g. wider at the mold body 152 than at the mold chase projection contact surface 164), such that removal of the mold chase 150 (see FIG. 5) from the mold material 172 (see FIG. 6) may be easier and such that the filling of the interconnection vias 174 (see FIG. 6) may be efficient, as will be understood to those skilled in the art.

Figure 8:
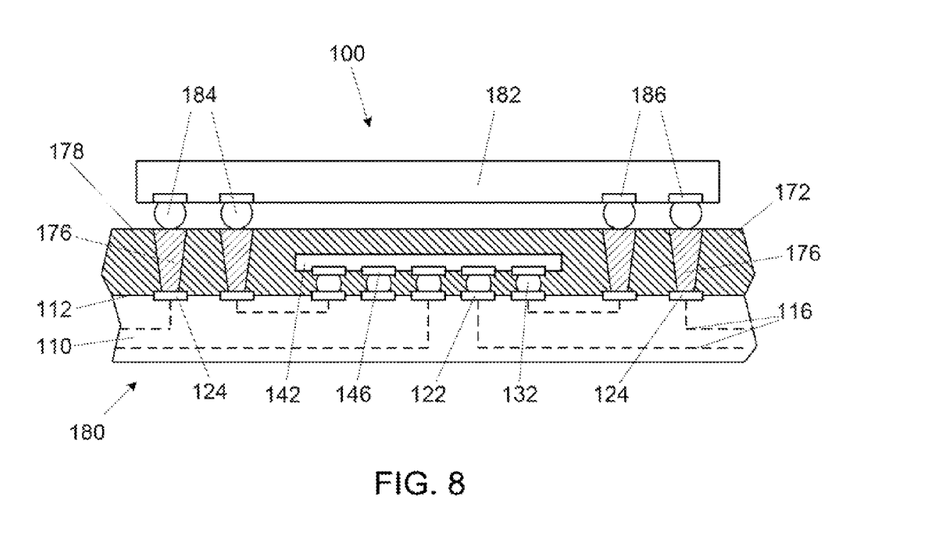

As shown in FIG. 8, a second microelectronic package or device 182 may be attached to the first microelectronic package 180 with a plurality of package-to-package interconnects 184 to form the package-on-package microelectronic device 100. The package-to-package interconnects 184 may extend between package attachment bond pads 186 of the second microelectronic package 182 and mirror-image through-mold interconnections 176 exposed on the mold material first surface 178 to form an electrical connections therebetween. It is understood that the microelectronic device bond pads 186 may be in electrical communication with integrated circuitry (not shown) within the second microelectronic package 182. The second microelectronic package 182 may include or be any appropriate microelectronic device, including, but not limited to a microprocessor, a chipset, a graphics device, a wireless device, a memory device, an application specific integrated circuit device, and the like.

Figure 9:
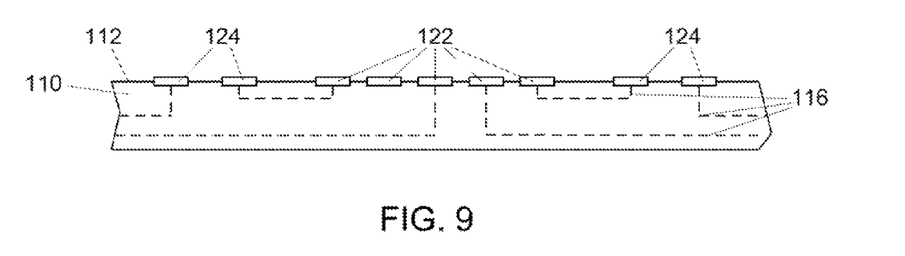
FIGS. 9-16 are side cross sectional views of a process of fabricating a package-on-package microelectronic device, according to another embodiment of the present description.
Figure 10:
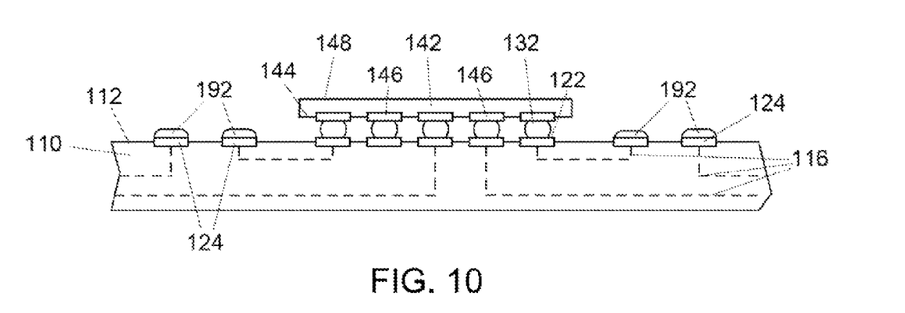

FIGS. 9-16 illustrate another embodiment of fabricating a package-on-package microelectronic device 100. As shown in FIG. 9, the microelectronic substrate 110 may be formed, such as described with regard to FIG. 1. As shown in FIG. 10, the microelectronic device 142 may be attached to the microelectronic substrate 110, such as described with regard to FIG. 2. As further shown in FIG. 10, the microelectronic substrate interconnection bond pads 124 may further include a protective bump 192. The protective bumps 192 may protect the microelectronic substrate interconnection bond pads 124 from contact with the mold chase, as will be discussed. The protective bumps 192 can be made any appropriate conductive material, including, but not limited to, solders and conductive filled epoxies. Solder materials may include may be any appropriate material, including but not limited to, lead/tin alloys, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys.

Figure 11:
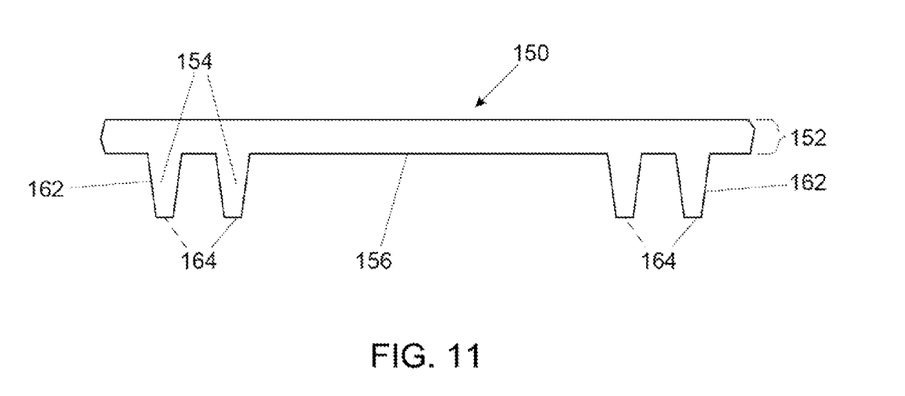

As shown in FIG. 11, a mold chase 150 may be formed in the manner discussed with regard to FIG. 3 with the exception that the resilient mold chase projection portion 166 may not be needed, as the protective bumps 192 may protect the microelectronic substrate interconnection bond pads 124 (see FIG. 10) from contact with the mold chase 150 and may absorb any height tolerances, as previously discussed.

Figures 12, 13:
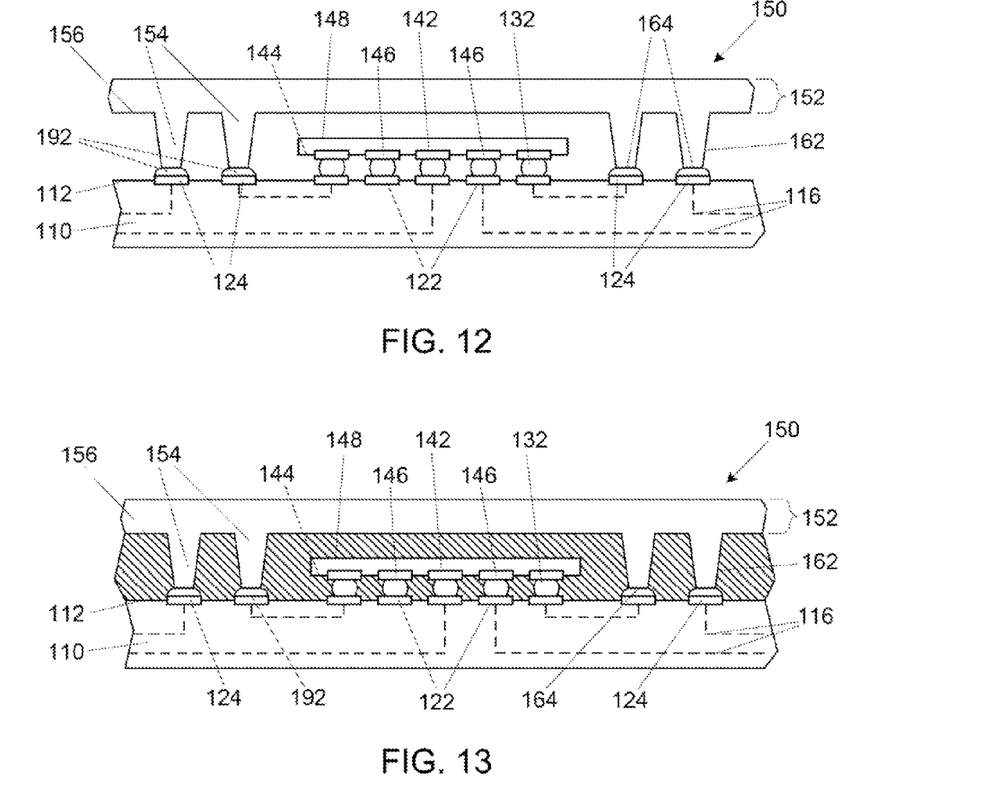

As shown in FIG. 12, the mold chase 150 may be brought into contact with the microelectronic substrate 110, wherein at least one mold chase projection contact surface 164 contacts a respective protective bump 192 of each of the microelectronic substrate interconnection bond pads 124. In one embodiment, a plurality mold chase projections 154 may have a mirror-image configuration to and in contact with a plurality of respective protective bumps 192 of each of the microelectronic substrate interconnection bond pads 124.

As shown in FIG. 13, a mold material 172 may be disposed between the microelectronic substrate 110 and the mold chase 150. In one embodiment, the mold material 172 may substantially encapsulate the microelectronic device 142 (e.g. extending over the microelectronic device back surface 148 and between the microelectronic device active surface 144 and the microelectronic substrate 110) and may substantially surround the at least one mold chase projection sidewall 162.

Figure 14:
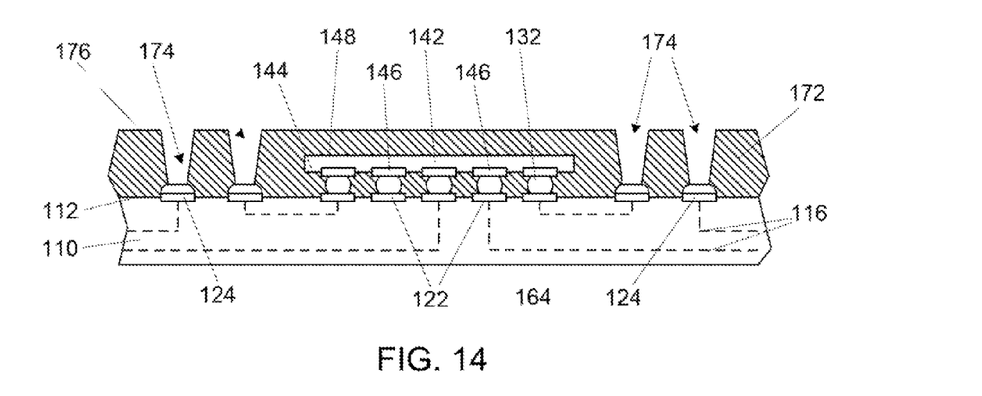
Figure 15:
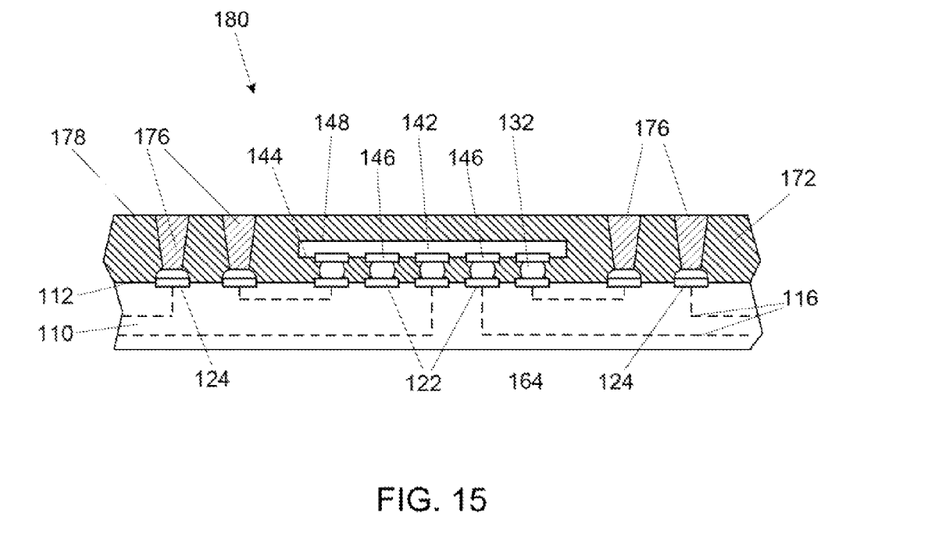
Figure 16:
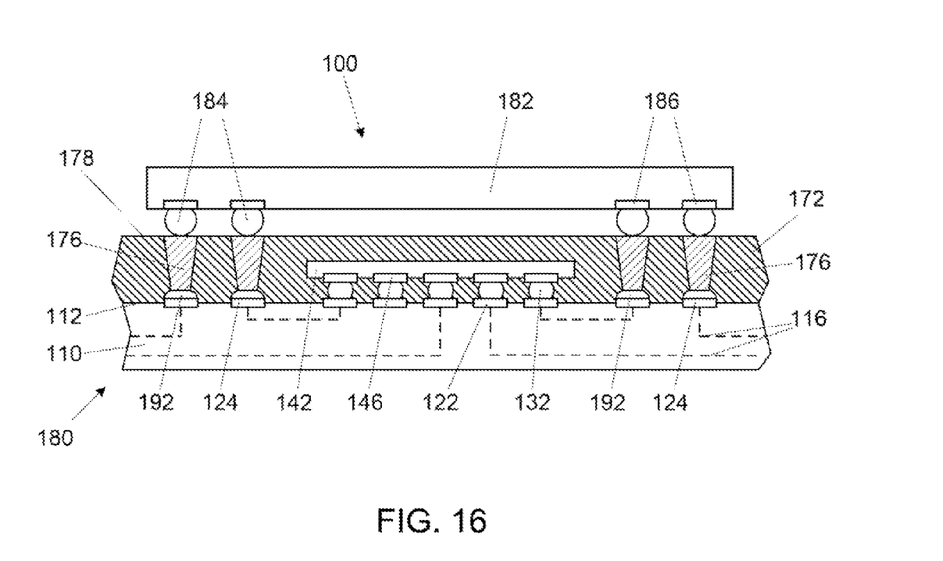

As shown in FIG. 14, the mold material 172 may be cured or partially cured and the mold chase 150 (see FIG. 13) may be removed to form the interconnection vias 174. As shown in FIG. 15, the interconnection vias 174 (see FIG. 14) may be filled with a conductive material to form through-mold interconnections 176, and thereby forming the first microelectronic package 180. As shown in FIG. 16, a second microelectronic package or device 182 may be attached to the first microelectronic package 180 with a plurality of package-to-package interconnects 184 to form the package-on-package microelectronic device 100, as described with regard to FIG. 8.

Figure 17:
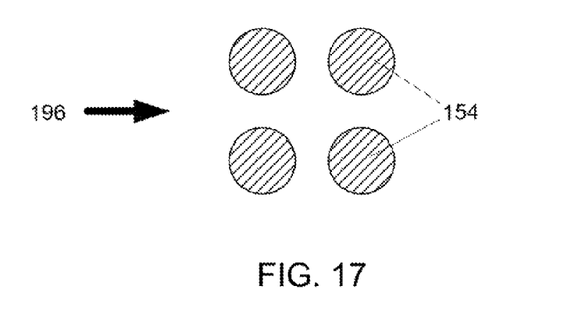
FIG. 17 is a cross sectional view along line 17-17 of FIG. 3, according to an embodiment of the present description.
Figure 18:
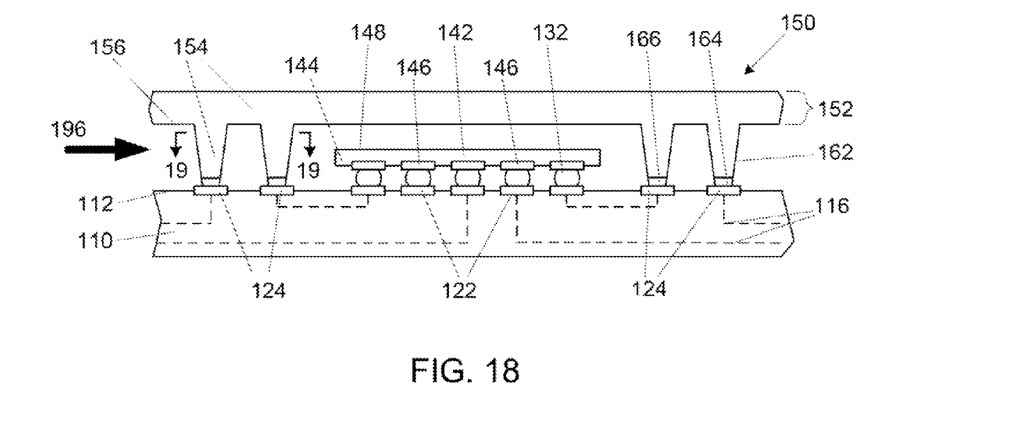
FIG. 18 is a side cross section view of the mold chase, according an embodiment of the present description.
Figure 19:
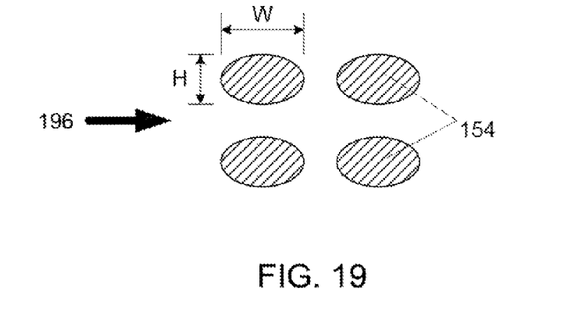
FIG. 19 is a cross sectional view along line 19-19 of FIG. 18, according to an embodiment of the present description.

FIG. 17 illustrates a cross sectional view along line 17-17 of FIG. 3. As it can be seen, the mold chase projections 154 may be substantially circular in cross section, where the cross section is substantially planar to the mold body first surface 156. This is a similar cross section as would be realized with the use of known drilling techniques. However, as will be understood to those skilled in the art and as shown in FIGS. 17 and 18, the mold material 172 (see FIG. 5) may flow in a single direction (generically arrow 196). Thus, the circular cross section of FIG. 17 may not be an efficient shape for the mold material flow 196. Therefore, a more efficient cross section shape may be used, such as an oval cross section shown in FIG. 19, (wherein the width W is longer than the height H and wherein the width W is substantially parallel to the mold material flow 196) to assist in the efficient flow 196 of the mold material 172 (see FIG. 5) and/or for a high density of mold chase projections 154. It is understood, that the oval cross section is merely exemplary and any low impedance cross section shape and/or high density shape could be utilized.

Figure 20:
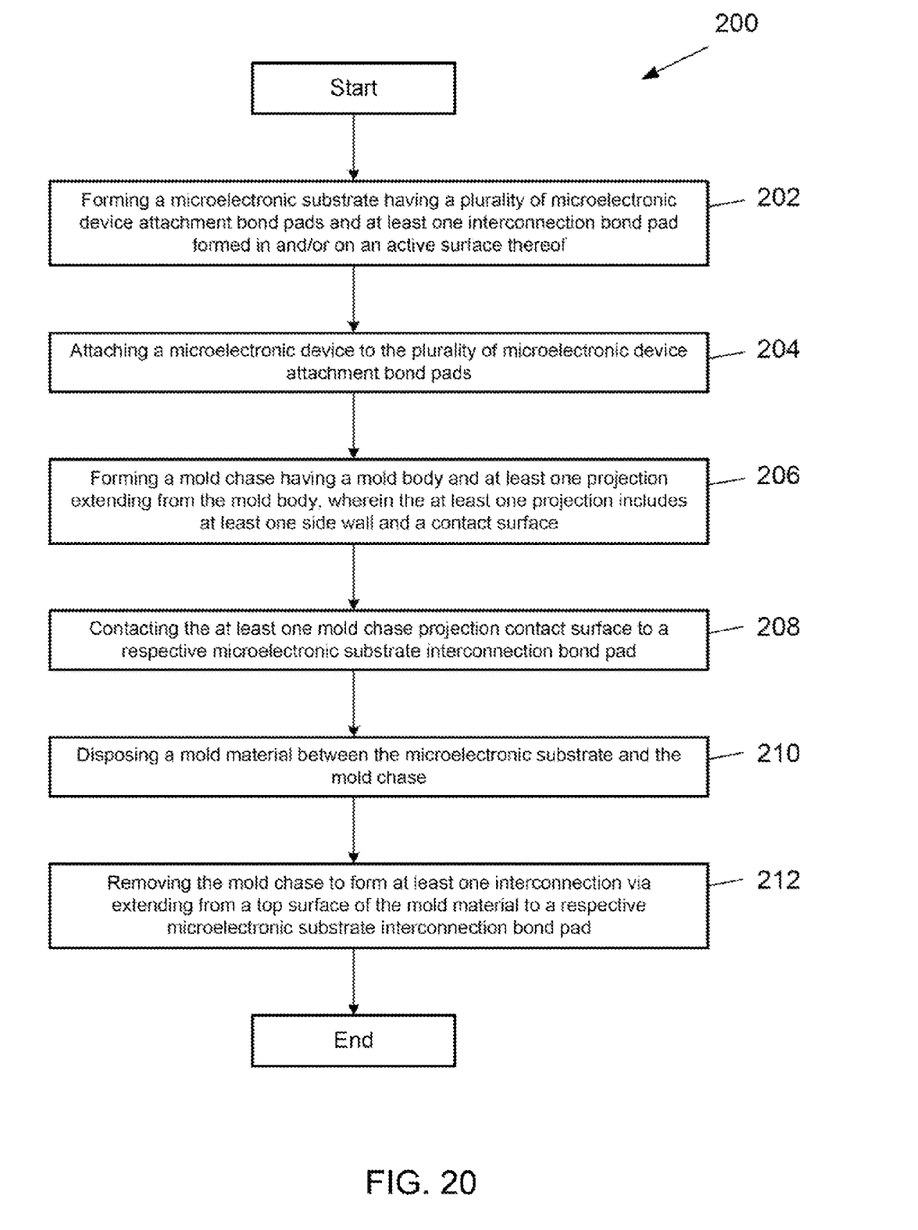
FIG. 20 is a flow chart of a process of fabricating a package-on-package microelectronic device, according to an embodiment of the present description.

FIG. 20 is a flow chart of a process 200 of fabricating a microelectronic device according to an embodiment of the present description. As set forth in block 202, a microelectronic substrate may be formed having a plurality microelectronic device attachment bond pads and at least one interconnection bond pad formed in and/or on an active surface thereof. A microelectronic device may be attached to the plurality of microelectronic device attachment bond pads, as set forth in block 204. As set forth in block 206, a mold chase may be formed having a mold body and at least one projection extending from the mold body, wherein the at least one projection includes at least one sidewall and a contact surface. At least one mold chase projection contact surface may be brought into contact with a respective microelectronic substrate interconnection bond pad, as set in block 208. As set forth in block 210, a mold material may be disposed between the microelectronic substrate and the mold chase. The mold chase may be removed to form at least one interconnection via extending from a top surface of the mold material to a respective microelectronic substrate interconnection bond pad, as set forth in block 212.

Figure 21:
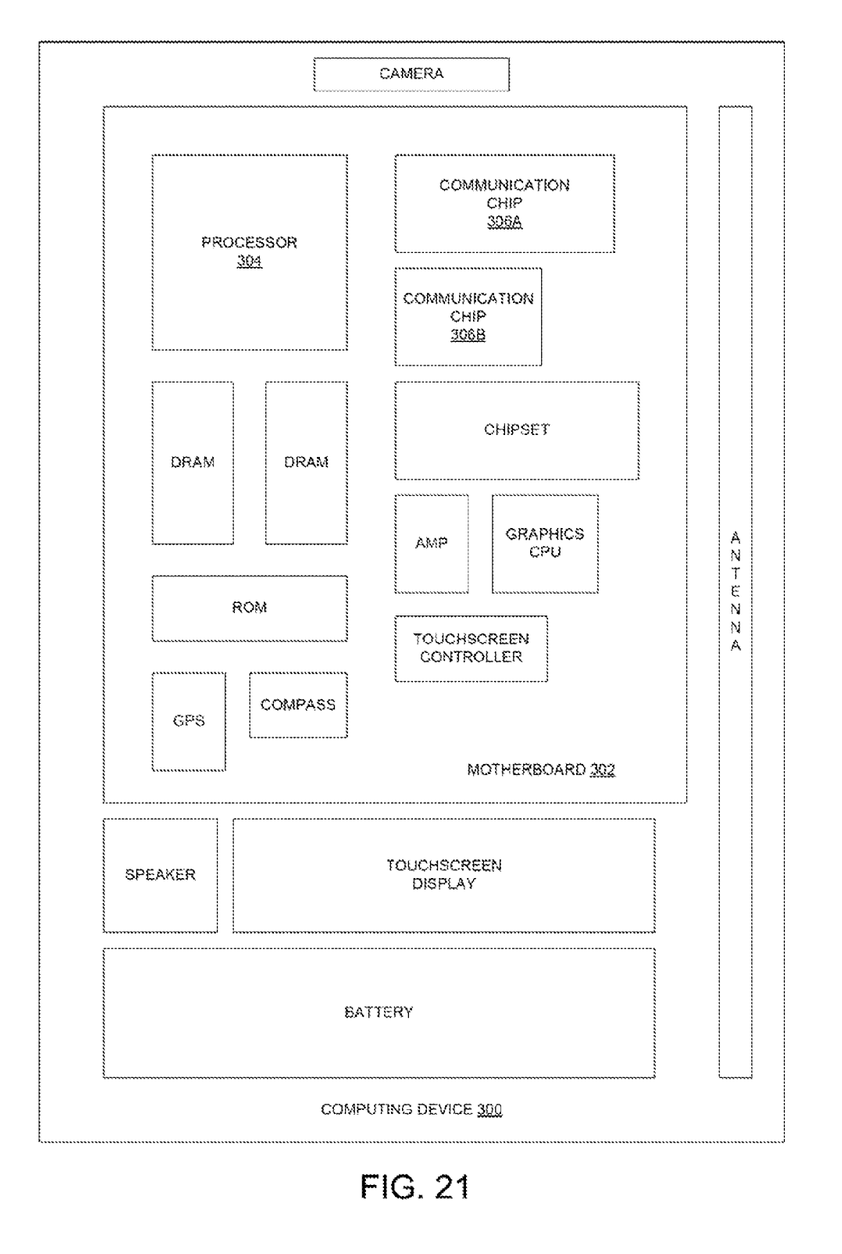
FIG. 21 illustrates a computing device in accordance with one implementation of the present description.

FIG. 21 illustrates a computing device 300 in accordance with one implementation of the present description. The computing device 300 houses a board 302. The board 302 may include a number of components, including but not limited to a processor 304 and at least one communication chip 306A, 306B. The processor 304 is physically and electrically coupled to the board 302. In some implementations the at least one communication chip 306A, 306B is also physically and electrically coupled to the board 302. In further implementations, the communication chip 306A, 306B is part of the processor 304.

Depending on its applications, the computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306A, 306B enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306A, 306B. For instance, a first communication chip 306A may be dedicated to shorter range wireless communications such as Wi-Fi and Bluetooth and a second communication chip 306B may be dedicated to longer range wireless communications such as GPS, EDGE, GPRS, CDMA, WiMAX, LTE, Ev-DO, and others.

The processor 304 of the computing device 300 may include package-on-package microelectronic device fabricated in the manner described above. The term "processor" may refer to any device or portion of a device that processes electronic data from registers and/or memory to transform that electronic data into other electronic data that may be stored in registers and/or memory. Furthermore, the communication chip 306A, 306B may include package-on-package microelectronic device fabricated in the manner described above.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

It is understood that the subject matter of the present description is not necessarily limited to specific applications illustrated in FIGS. 1-21. The subject matter may be applied to other microelectronic device and assembly applications, as will be understood to those skilled in the art.

The following examples pertain to further embodiments, wherein Example 1 is a method of fabricating a microelectronic device comprising forming a microelectronic substrate having a plurality of microelectronic device attachment bond pads and at least one interconnection bond pad formed in and/or on an active surface thereof; attaching a microelectronic device to the plurality of microelectronic device attachment bond pads; forming a mold chase having a mold body and at least one projection extending from the mold body, wherein the at least one projection includes at least one sidewall and a contact surface; contacting the at least one mold chase projection contact surface to a respective microelectronic substrate interconnection bond pad; disposing a mold material between the microelectronic substrate and the mold chase; and removing the mold chase to form at least one interconnection via extending from a top surface of the mold material to a respective microelectronic substrate interconnection bond pad.

In Example 2, the subject matter of Example 1 can optionally include filling the at least one interconnection via with a conductive material to form a through-mold interconnection.

In Example 3, the subject matter of any of Examples 1 and 2 can optionally include curing the mold material prior the removing the mold chase.

In Example 4, the subject matter of any of Examples 1 to 3 can optionally include disposing the mold material between the microelectronic substrate and the mold chase to substantially encapsulate the microelectronic device and surrounds the at least one interconnection projection sidewall.

In Example 5, the subject matter of any of Examples 1 to 4 can optionally include forming a portion of the at least one mold chase projection proximate and including the mold chase projection contact surface from a resilient material.

In Example 6, the subject matter of any of Examples 1 to 5 can optionally include forming a microelectronic substrate having an active surface with a plurality microelectronic device attachment bond pads and at least one interconnection bond pad having a protective bump formed in and/or on the microelectronic substrate active surface.

In Example 7, the subject matter of Example 6 can optionally include forming the microelectronic substrate comprises forming the protective bump from a solder material.

In Example 8, the subject matter of either of Examples 6 or 7 can optionally include contacting the mold chase projection contact surface to a respective microelectronic substrate interconnection bond pad comprising contacting the mold chase projection contact surface to a respective protective bump of the microelectronic substrate interconnection bond pad.

In Example 9, the subject matter of any of Examples 1 to 8 can optionally include at least one mold chase projection having a cross section shape having a width greater than a height.

The following examples pertain to further embodiments, wherein Example 10 is a method of fabricating a package-on-package microelectronic device comprising forming a first package comprising forming a microelectronic substrate having a plurality microelectronic device attachment bond pads and at least one interconnection bond pad formed in and/or on an active surface thereof; attaching a microelectronic device to the plurality of microelectronic device attachment bond pads; forming a mold chase having a mold body and at least one projection extending from the mold body, wherein the at least one projection includes at least one sidewall and a contact surface; contacting the at least one mold chase projection contact surface to a respective microelectronic substrate interconnection bond pad; disposing a mold material between the microelectronic substrate and the mold chase; and removing the mold chase to form at least one interconnection via extending from a top surface of the mold material to a respective microelectronic substrate interconnection bond pad; and filling the at least one interconnection via with a conductive material to form at least one through-mold interconnection; and attaching a second package to the first package, wherein an electrically connection is formed from the second package to the at least one through-mold interconnect of the first package.

In Example 11, the subject matter of Example 10 can optionally include curing the mold material prior the removing the mold chase.

In Example 12, the subject matter of any of Examples 10 to 12 can optionally include disposing the mold material between the microelectronic substrate and the mold chase to substantially encapsulate the microelectronic device and surrounds the at least one interconnection projection sidewall.

In Example 13, the subject matter of any of Examples 10 to 12 can optionally include forming a portion of the at least one mold chase projection proximate and including the mold chase projection contact surface from a resilient material.

In Example 14, the subject matter of any of Examples 10 to 13 can optionally include forming the microelectronic substrate comprising forming a microelectronic substrate having an active surface with a plurality microelectronic device attachment bond pads and at least one interconnection bond pad having a protective bump formed in and/or on the microelectronic substrate active surface.

In Example 15, the subject matter of Example 14 can optionally include forming the protective bump from a solder material.

In Example 16, the subject matter of any of Examples 10 to 15 can optionally include contacting the mold chase projection contact surface to a respective microelectronic substrate interconnection bond pad comprising contacting the mold chase projection contact surface to a respective protective bump of the microelectronic substrate interconnection bond pad.

In Example 17, the subject matter of any of Examples 10 to 16 can optionally include at least one mold chase projection has a cross section shape having a width greater than a height.

The following examples pertain to further embodiments, wherein Example 10 is a method of fabricating an electronic system, comprising forming a board; and attaching a package-on-package microelectronic device on the board, wherein the package-on-package microelectronic device formed by forming a first package comprising forming a microelectronic substrate having a plurality microelectronic device attachment bond pads and at least one interconnection bond pad formed in and/or on an active surface thereof; attaching a microelectronic device to the plurality of microelectronic device attachment bond pads; forming a mold chase having a mold body and at least one projection extending from the mold body, wherein the at least one projection includes at least one sidewall and a contact surface; contacting the at least one mold chase projection contact surface to a respective microelectronic substrate interconnection bond pad; disposing a mold material between the microelectronic substrate and the mold chase; and removing the mold chase to form at least one interconnection via extending from a top surface of the mold material to a respective microelectronic substrate interconnection bond pad; and filling the at least one interconnection via with a conductive material to form at least one through-mold interconnection; and attaching a second package to the first package, wherein an electrically connection is formed from the second package to the at least one through-mold interconnect of the first package.

In Example 19, the subject matter of Example 18 can optionally include curing the mold material prior the removing the mold chase.

In Example 20, the subject matter of any of Examples 18 to 19 can optionally include disposing the mold material comprising disposing the mold material between the microelectronic substrate and the mold chase to substantially encapsulate the microelectronic device and surrounds the at least one interconnection projection sidewall.

In Example 21, the subject matter of any of Examples 18 to 20 can optionally include forming a portion of the at least one mold chase projection proximate and including the mold chase projection contact surface from a resilient material.

In Example 22, the subject matter of any of Examples 18 to 21 can optionally include forming the microelectronic substrate comprising forming a microelectronic substrate having an active surface with a plurality microelectronic device attachment bond pads and at least one interconnection bond pad having a protective bump formed in and/or on the microelectronic substrate active surface.

In Example 23, the subject matter of Example 22 can optionally include forming the protective bump from a solder material.

In Example 24, the subject matter of any of Examples 22 to 23 can optionally include contacting the mold chase projection contact surface to a respective microelectronic substrate interconnection bond pad comprising contacting the mold chase projection contact surface to a respective protective bump of the microelectronic substrate interconnection bond pad.

In Example 25, the subject matter of any of Examples 18 to 24 can optionally include at least one mold chase projection having a cross section shape having a width greater than a height, wherein the width is oriented in a direction of flow of the mold material.

Having thus described in detail embodiments of the present description, it is understood that the present description defined by the appended claims is not to be limited by particular details set forth in the above description, as many apparent variations thereof are possible without departing from the spirit or scope thereof.

The invention claimed is:

1. A method of fabricating a microelectronic device comprising:

forming a microelectronic substrate having a plurality of microelectronic device attachment bond pads and at least one interconnection bond pad formed in and/or on an active surface thereof;

attaching a microelectronic device to the plurality of microelectronic device attachment bond pads;

forming a mold chase having a mold body and at least one projection extending from the mold body, wherein the at least one projection includes at least one sidewall and a contact surface, and wherein the at least one projection includes a portion comprising a resilient material that is different from the material of the remainder of the at least one projection, and wherein the portion of the at least one projection includes the mold chase projection contact surface;

contacting the at least one mold chase projection contact surface to a respective microelectronic substrate interconnection bond pad;

disposing a mold material between the microelectronic substrate and the mold chase; and removing the mold chase to form at least one interconnection via extending from a top surface of the mold material to a respective microelectronic substrate interconnection bond pad.

2. The method of claim 1, further comprising filling the at least one interconnection via with a conductive material to form a through-mold interconnection.

3. The method of claim 1, further comprising curing the mold material prior the removing the mold chase.

4. The method of claim 1, wherein disposing the mold material comprises disposing the mold material between the microelectronic substrate and the mold chase to substantially encapsulate the microelectronic device and surrounds the at least one interconnection projection sidewall.

5. The method of claim 1, wherein forming the microelectronic substrate comprises forming a microelectronic substrate having an active surface with a plurality microelectronic device attachment bond pads and at least one interconnection bond pad having a protective bump formed in and/or on the microelectronic substrate active surface.

6. The method of claim 5, wherein forming the microelectronic substrate comprises forming the protective bump from a solder material.

7. The method of claim 1, wherein contacting the mold chase projection contact surface to a respective microelectronic substrate interconnection bond pad comprises contacting the mold chase projection contact surface to a respective protective bump of the microelectronic substrate interconnection bond pad.

8. The method of claim 1, wherein the at least one mold chase projection has a cross section shape having a width greater than a height.

9. The method of claim 1, wherein attaching a microelectronic device to the plurality of microelectronic device attachment bond pads comprises forming solder interconnects between microelectronic device to the plurality of microelectronic device attachment bond pads.

10. The method of claim 1, wherein attaching a microelectronic device to the plurality of microelectronic device attachment bond pads comprises forming conductive filled epoxy interconnects between microelectronic device to the plurality of microelectronic device attachment bond pads.

11. The method of claim 1, wherein forming the mold chase having the mold body and the at least one projection extending from the mold body, wherein the at least one projection includes the at least one sidewall and the contact surface comprises the at least one projection extending from a first surface of the mold body, wherein the contact surface is substantially parallel to the mold body first surface.

12. The method of claim 1, wherein the portion of the at least one mold chase projection comprises a material selected from the group consisting from butyl rubbers, ethylene rubber, and fluoropolymer elastomers.

13. The method of claim 1, wherein disposing the mold material between the microelectronic substrate and the mold chase comprises disposing an epoxy resin mold material between the microelectronic substrate and the mold chase.

14. The method of claim 2, wherein filling the at least one interconnection via with the conductive material to form the through-mold interconnection comprises filling the at least one interconnection via with solder to form the through-mold interconnection.

* * * * *